(12) United States Patent
Joshi et al.

(10) Patent No.: US 10,177,542 B2
(45) Date of Patent: Jan. 8, 2019

(54) CONTACTOR HEALTH MONITORING SYSTEMS AND METHODS

(71) Applicant: Hamilton Sundstrand Corporation, Charlotte, NC (US)

(72) Inventors: Ashutosh Joshi, Roscoe, IL (US); Debabrata Pal, Hoffman Estates, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 5 days.

(21) Appl. No.: 15/429,830

(22) Filed: Feb. 10, 2017

(65) Prior Publication Data

US 2018/0233884 A1 Aug. 16, 2018

(51) Int. Cl.
| | | |
|---|---|---|
| H05K 7/20 | (2006.01) | |
| H02B 1/04 | (2006.01) | |
| G01R 31/327 | (2006.01) | |
| H01H 11/00 | (2006.01) | |
| H01H 9/02 | (2006.01) | |
| H02B 1/24 | (2006.01) | |
| H01H 71/08 | (2006.01) | |
| H01H 71/12 | (2006.01) | |
| H01H 71/04 | (2006.01) | |
| G01R 31/00 | (2006.01) | |

(52) U.S. Cl.
CPC ............ *H02B 1/04* (2013.01); *G01R 31/3277* (2013.01); *H01H 9/0271* (2013.01); *H01H 11/0062* (2013.01); *H02B 1/24* (2013.01); *G01R 31/008* (2013.01); *H01H 71/08* (2013.01); *H01H 71/125* (2013.01); *H01H 2011/0068* (2013.01); *H01H 2071/044* (2013.01)

(58) Field of Classification Search
None
See application file for complete search history.

(56) References Cited

U.S. PATENT DOCUMENTS

| | | | | |
|---|---|---|---|---|
| 7,837,496 B1 * | 11/2010 | Pal | ...................... | H01R 9/2466 |
| | | | | 361/712 |
| 9,137,925 B2 * | 9/2015 | Pal | ..................... | H05K 7/20154 |
| 9,153,946 B2 * | 10/2015 | Pal | ......................... | H02B 1/056 |
| 9,531,170 B2 * | 12/2016 | Pal | ........................... | H02B 1/56 |
| 9,613,764 B1 * | 4/2017 | Pal | .......................... | H01H 1/62 |
| 2008/0013596 A1 | 1/2008 | Dunne et al. | | |

(Continued)

FOREIGN PATENT DOCUMENTS

| | | |
|---|---|---|
| EP | 1107274 A1 | 6/2001 |
| EP | 2680289 A1 | 1/2014 |

(Continued)

OTHER PUBLICATIONS

European Search Report dated Jun. 13, 2018 in corresponding European Patent Application No. 18156251.3.

*Primary Examiner* — Courtney L Smith
(74) *Attorney, Agent, or Firm* — Locke Lord LLP; Scott D. Wofsy; Christopher J. Cillié

(57) ABSTRACT

A contactor arrangement includes a post, a fastener and a temperature sensor. The post defines a post axis. The fastener is fixed to the post along the post axis. The temperature sensor is in thermal communication with the contactor conductor and post through the fastener and is electrically insulated from the post for monitoring resistive heat generation in a contactor fixed to the post by the fastener.

20 Claims, 6 Drawing Sheets

(56) References Cited

U.S. PATENT DOCUMENTS

| | | | | |
|---|---|---|---|---|
| 2008/0094068 A1* | 4/2008 | Scott | ............... | G01R 31/3675 |
| | | | | 324/426 |
| 2013/0257569 A1* | 10/2013 | Pal | ............... | H01H 50/043 |
| | | | | 335/202 |
| 2014/0002995 A1* | 1/2014 | Pal | ............... | H01H 1/62 |
| | | | | 361/712 |
| 2015/0362215 A1* | 12/2015 | Lesage | ............... | F24H 9/2021 |
| | | | | 248/213.2 |

FOREIGN PATENT DOCUMENTS

| | | |
|---|---|---|
| EP | 2775457 A1 | 9/2014 |
| KR | 20090130992 A | 12/2009 |
| KR | 20120113306 A | 10/2012 |
| WO | WO-00/39823 A1 | 7/2000 |

\* cited by examiner

CONTACTOR HEALTH MONITORING SYSTEMS AND METHODS

BACKGROUND OF THE INVENTION

1. Field of the Invention

The present disclosure relates to electrical systems, and more particularly to health monitoring of electrical system components such as contactors.

2. Description of Related Art

Power distribution systems, such as in aircraft, commonly include power switching devices to control the current flow between power sources and power consuming devices. Examples of power sources include batteries, main engine generators, and auxiliary power unit. Examples of power consuming devices include heating, lighting, controllers, actuators and motors. Switching may be effected by circuit breakers, solid-state devices and/or contactors.

With the advent of the 'more electric' aircraft, power distribution systems are increasingly called upon to carry larger currents to power greater numbers of power consuming devices. The switching in such power distribution systems is generally done by contactors, which typically have relatively high current ratings, e.g., 200 amps or higher, and are housed within power distribution panels from which they control the flow of power to power consuming devices connected to the power distribution panel. Contactor operation is generally effected by a relatively low current control bus which is routed to the power distribution panels and contactors therein. In some power distribution systems contactors can require periodic replacement, such as from the thermal effects of resistive heating.

Such conventional methods and systems have generally been considered satisfactory for their intended purpose. However, there is still a need in the art for improved contactor arrangements and methods of contactor monitoring. The present disclosure provides a solution for this need.

SUMMARY OF THE INVENTION

A contactor arrangement includes a post, a fastener, and one or more temperature sensor. The post defines a post axis. The fastener is fixed to the post along the post axis. The sensor is in thermal communication with the post through the fastener and is electrically insulated from the post for monitoring resistive heat generation in a contactor fixed to the post by the fastener.

In certain embodiments, the sensor can include a neutral temperature coefficient thermistor, a thermocouple, or a semiconductor-type sensor. The arrangement can include a contactor with the conductor fixing the contactor between the fastener and an end of the post. A bus bar can be fixed to an end of the post opposite the conductor. The sensor can be coupled to the contactor arrangement by epoxy or solder. A washer can be seated between the fastener and the post. The washer can include a tab extending radially from the post.

In accordance with certain embodiments, the sensor can be bonded to the fastener along an axis of the post. The sensor can be electrically isolated from electrical surfaces carrying high electrical current. The fastener can have a head and a threaded segment arrange at opposite ends. The threaded segment can be arranged along the post axis. The head can protrude from an end of the post. The sensor can be seated in the head. The can have a cavity. The sensor can be potted in the cavity by the epoxy or solder. The head can include flats arranged about the cavity for applying a preload to the fastener. A wave washer can be seated between the head and post.

A method of monitoring health of a contactor includes monitoring ambient temperature around the contactor, monitoring current passing across the contactor, and monitoring temperature of the contactor while current is passing across the contactor. A health state of the contactor is determined based on empirical data gathered on similar contactors under similar conditions of ambient temperature and current load.

In certain embodiments, determining a health state can include comparing the temperature of the contactor with a specification limit and flagging the contactor for service if the temperature of the contactor exceeds the specification limit. Determining a health state can also include one or more of comparing the temperature of the contactor with a design limit and flagging the contactor as degraded if the temperature of the contactor exceeds the design limit, comparing the temperature of the contactor with a warning limit and comprising flagging the contactor for service if the temperature of the contactor exceeds the warning limit.

A power distribution panel includes a contactor arrangement as described above, a contactor connected between the fastener and an end of the post by the conductor, and a bus bar fixed to an end of the post opposite the conductor. A control module is disposed in communication with the contactor, the sensor and the power distribution panel. In certain embodiments, a temperature lead can connect the temperature sensor to the control module to provide temperature information to the control module. A contactor lead can operatively connect the contactor with the control module to provide electrical information to the control module. A panel lead can connect the control module to the power panel to provide electrical information to the control module. The control module can be a bus power control unit. In accordance with certain embodiments, the control module can include a memory. The memory can have instructions recorded on it that, where read by the control module, cause the control module to execute the steps of the above-described method.

These and other features of the systems and methods of the subject disclosure will become more readily apparent to those skilled in the art from the following detailed description of exemplary embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
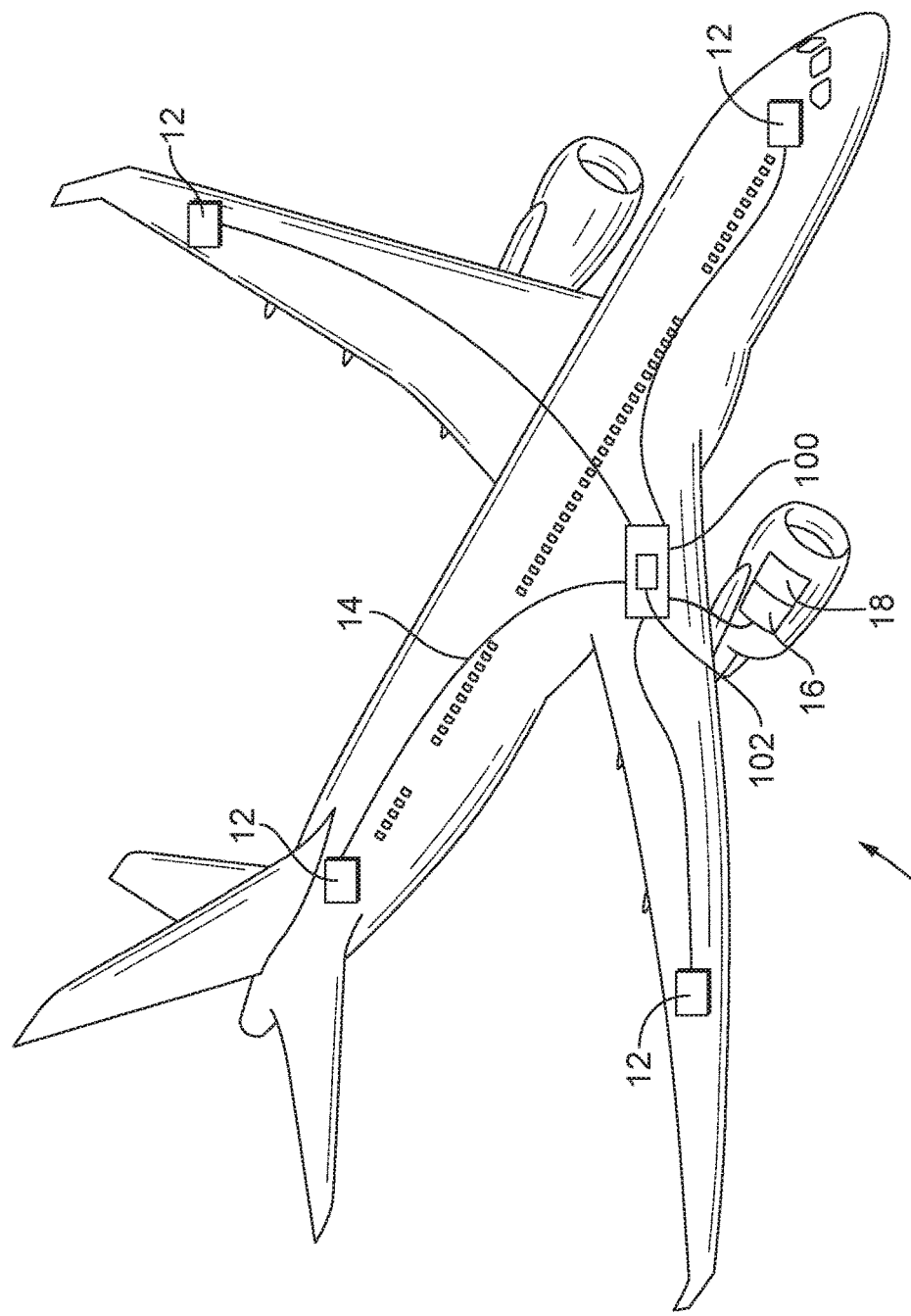
FIG. 1 is a schematic view of an exemplary embodiment of an aircraft constructed in accordance with the present disclosure, showing an aircraft electrical system with a power distribution panel and a contactor arrangement.

Reference will now be made to the drawings wherein like reference numerals identify similar structural features or aspects of the subject disclosure. For purposes of explanation and illustration, and not limitation, a partial view of an exemplary embodiment of a contactor arrangement in accordance with the disclosure is shown in FIG. 1 and is designated generally by reference character 100. Other embodiments of contactor arrangements, power distribution panels having such contactor arrangements, and methods of monitoring contactor health in accordance with the disclosure, or aspects thereof, are provided in FIGS. 2-5B, as will be described. The systems and methods described herein can be used for monitoring the health of contactors, such as in aircraft electrical systems, though the present disclosure is not limited to contactors or to aircraft electrical systems in general.

Referring to FIG. 1, an aircraft 10 is shown. Aircraft 10 includes a plurality of power consuming devices 12 connected to a power distribution system 14. Power distribution system 14 includes a power distribution panel 100 having a contactor arrangement 102 which is connected to a power source 16 for providing electrical power to power consuming devices 12. Power source 16, which can be a main generator or auxiliary power unit, is in turn operatively connected to an engine 18, receives mechanical rotation from engine 18 and generates electrical power using the mechanical rotation received from engine 18. The electrical power is selectively applied to power consuming devices by operation of contactors included in contactor arrangement 102. In the illustrated exemplary embodiment power distribution panel 100 is located in an electrical equipment bay 20 (shown in FIG. 2) of aircraft 10, which may be unpressurized or pressurized to a limited altitude.

Figure 2:
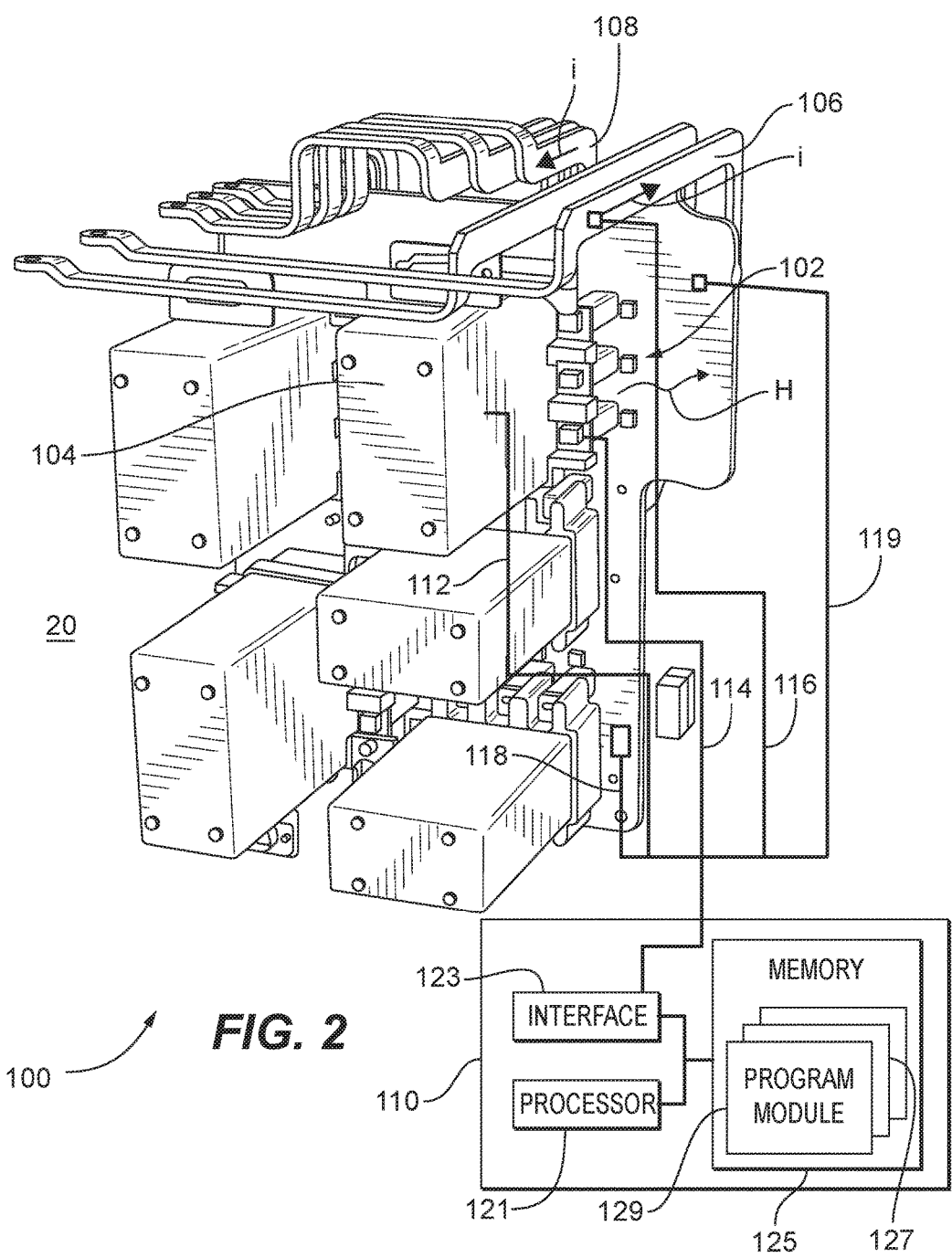
FIG. 2 is a perspective view of the power distribution panel of FIG. 1, showing a contactor arrangement connected to a control module with a contactor arranged between an input bus bar and an output bus bar.

With reference to FIG. 2, power distribution panel 100 is shown. Power distribution panel 100 includes at least one contactor 104 housed within power distribution panel 100. Contactor 104 is in electrical communication with an input bus bar 106 and an output bus bar 108 through contactor arrangement 102 and has an off-state and an off-state. In the off-state contactor 104 electrically separates output bus bar 108 from input bus bar 106. In the on-state contactor 104 electrically connects output bus bar 108 with input bus bar 106, allowing a flow of electrical current i to flow from input bus bar 106, across contactor 104, and into output bus bar 108. Switching between the off-state and on-state (and vice versa) is effected by a switching element (not shown for reasons of clarity) contained within contactor 104, which switches between states according to a switching command signal received from a control module 110 received therefrom via a contactor control lead 112, and may be a bus power control unit (BPCU).

As will be appreciated by those of skill in the art, current flow through current carrying components generates heat through resistive heating of the respective current carrying components, schematically indicated by heat H in FIG. 2. Heat H typically dissipates into the ambient environment, e.g., into electrical equipment bay 20 housing power distribution panel 100, during the course of operation of aircraft 10 (shown in FIG. 1) without issue. However, in some power distribution panels, heat generation in a power distribution panel can increase during operation such that the reliability of the contactors contained within the power distribution panel is potentially compromised. For example, heat generation is some contactors can increase due to usage, e.g., cycling of the switching element contained within the contactor, over time. The resistivity of certain current carrying components can also increase over time, such as when bolted joints between surfaces of conducting elements loosen, increasing resistivity of the joint and causing increased heat generation commensurate with the resistivity increase of the joint. Exposure to increased amounts of heat over time can necessitate replacement of the contactor and/or service components within the power distribution panel. Power distribution panels in aircraft, which are located in unpressurized or partially pressurized electrical equipment bays and can have contactors arranged to carry currents very near their rated loads in order to minimize weight and/or space, can be particularly sensitive to increases in heat generation.

In order to monitor heat generation power distribution panel 100 includes health monitoring functionality in the BPCU, i.e., control module 110. In this respect control module 110 includes a processor 121 disposed in communication with an interface 123 and a non-transitory machine-readable memory 125. Interface 123 is connected to power distribution panel 100 by one or more health signal leads to provide indication of health of contactor 104 and/or contactor arrangement 102. In the illustrated exemplary embodiment a contactor temperature lead 114 connects contactor arrangement 102 with control module 110 with a contactor temperature sensor to provide a contactor arrangement temperature signal to control module 110. A load lead 116 connects a current sensor coupled to input bus bar 106 and/or output bus bar 108 with control module 110 to provide a signal indicative of current flow through contactor 104 and/or voltage drop across contactor 104 at a given load. A panel ambient temperature lead 118 connects an ambient temperature sensor with control module 110 to provide a signal indicative of ambient temperature within electrical equipment bay 20 to control module 110. A panel ambient pressure lead 119 connects an ambient pressure sensor with control module 110 to provide a signal indicative of ambient pressure within electrical equipment bay 20 to control module 110.

Memory 125 has a plurality of program modules 129 recorded thereon that, when read by processor 121, causes control module 110 to undertake certain actions. Among those actions are steps of contactor health monitoring method 200 (shown in FIG. 3). While a specific type of control module is described above, it is to be understood and appreciated that control module 160 can be implemented as circuitry, software, or a combination of circuitry and software, as suitable for an intended application. Memory 125 also has recorded on it a temperature reference 127 which includes one or more of a specification limit, a design limit, and thermal model.

The specification limit is a fixed reference which represents the maximum current that can flow across contactor 104 irrespective of the contactor installation and operating conditions of contactor 104. The design limit is a fixed reference which is lower than that the specification limit which represents the maximum current that can flow across contactor 104 for the installation of contactor 104 in power distribution panel 100 without consideration of the actual operating conditions of contactor 104. The thermal model is an algorithm which generates a warning limit which is a function of the actual operating conditions of contactor 104. It is contemplated that thermal model can adjust the warning limit according to one or more of ambient temperature, ambient pressure, current flow across contactor 104, and/or the contactor temperature.

Figure 3:
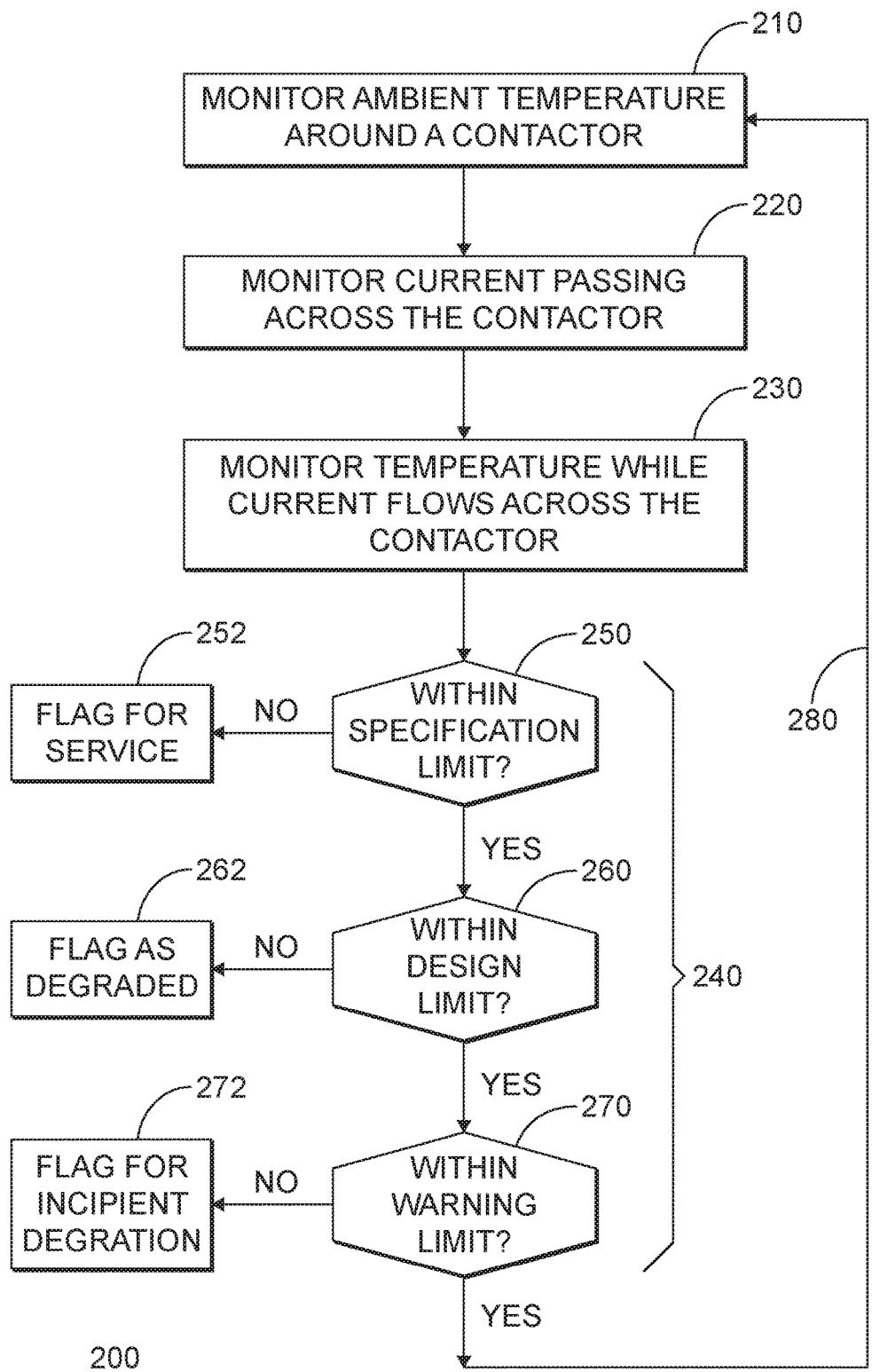
FIG. 3 is a block diagram of a method of determining health of a contactor, showing steps of the method.

With reference to FIG. 3, method 200 of monitoring health of a contactor, e.g., contactor 104 (shown in FIG. 2), is shown. Method 200 generally includes monitoring ambient temperature around the contactor, as shown with box 210. Method 200 also includes monitoring current passing across the contactor, as shown with box 220, and monitoring temperature of the contactor while current is passing across the contactor, as shown with box 230. A health state of the contactor is determined based on one or more of empirical data gathered on similar contactors under similar conditions of ambient temperature and current load as generally indicated by bracket 240.

Monitoring 210 ambient temperature around the contactor can include receiving ambient temperature information from a temperature sensor disposed within the contactor environment. For example, ambient temperature information can be received from an ambient temperature sensor (shown in FIG. 2) connected to control module 110 (shown in FIG. 2) via ambient temperature lead 118 (shown in FIG. 2).

Monitoring 220 current passing across the contactor includes receiving current information from a current sensor (shown in FIG. 2) in electrical communication with the contactor. For example, current flow information can be received from a current sensor (shown in FIG. 2) connected to control module 110 (shown in FIG. 2) via load lead 116.

Monitoring 230 temperature while current flows across the contactor include receiving contactor temperature information from contactor 104 through a temperature sensor (shown in FIG. 2) in thermal communication with contactor 104. In the illustrated exemplary embodiment the contactor temperature is received via contactor temperature lead 114 from one or more phases of contactor 104. Temperature information from contactor 104 can be received in concert with current flow information, ambient temperature information, and/or ambient pressure information, as suitable for the application of contactor 104.

Determining 240 a health state of the contactor includes comparing the contactor temperature with a specification limit, as shown with box 250. When the comparison indicates that the contactor temperature is above the specification limit the contactor is flagged for service, as shown with box 252. Flagging the contactor for service can include taking immediate action, such as opening the contactor or shedding load serviced by the contactor, as suitable for the contactor application. When the comparison indicates that the contactor temperature is below the specification limit the contactor temperature is compared with a design limit, as shown with box 260.

The design limit is below the specification limit and it takes into account the particular application of the contactor. When the comparison indicates that the contactor temperature is above the design limit the contactor is flagged as degraded, as shown with box 262. Contactors flagged as degraded can be scheduled for intermediate action, such as for inspection and/or replacement during a scheduled maintenance event. When the comparison indicates that the contactor temperature is below the design limit the contactor temperature is compared to a warning, as shown with box 270.

The warning limit is lower than the design limit and is indicative of whether the contactor temperature is anomalous. When the comparison indicates that the contactor temperature is above the warning limit the contactor is flagged for incipient degradation, as shown with box 272. For example, an incipient degradation flag can mean that degraded performance is expected absent investigation into the cause of the contactor temperature reported. When the comparison indicates that the contactor temperature is below the warning limit temperature monitoring continues, as shown with arrow 280.

It is contemplated that the warning limit take into account the actual operating conditions of the contactor at the time the contactor measurement is acquired. For example, control module 110 can include a thermal module stored on memory 125. The thermal model can be generic to contactor by type. The thermal model can be unique to a particular contactor and contactor installation. It is contemplated that the thermal module can receive, as input, current flow information via a current sensor, e.g., current sensor 115 (shown in FIG. 2), ambient temperature via an ambient temperature sensor, e.g., temperature sensor 130 (shown in FIG. 2), contactor temperature via a temperature sensor, via temperature sensor 144 (shown in FIG. 4) or temperature sensor 344 (shown in FIG. 4), and/or ambient pressure information via a pressure sensor, e.g., pressure sensor (shown in FIG. 2). Based on the received information the module can generate warning limit associated with the operating conditions of the contactor at the time a contactor temperature measurement is reported, which allows for detection of incipient degradation as such indication may be discernable, at least initially, when the contactor is stressed by a particular operating regime.

The warning limit can take into account one or more variables which vary over time. For example, ambient air temperature can be included in the contactor temperature determination. Altitude or ambient air pressure can be included in the contactor temperature determination. Contactor voltage drop at rated load can be included in the contactor temperature determination. Average bolted joint resistance R (shown in FIG. 4), based on an initial measurement of total resistance, can be included in determining contactor temperature. Since ambient temperature may vary according a particular aircraft or region of operation, contactor voltage drop can change over time as the contactor ages, and bolted joint resistance can increase over time as preloading dissipates, including one or more of these variables in the temperature determination can provide indication of the present state of degradation within the contactor arrangement.

Figure 4:
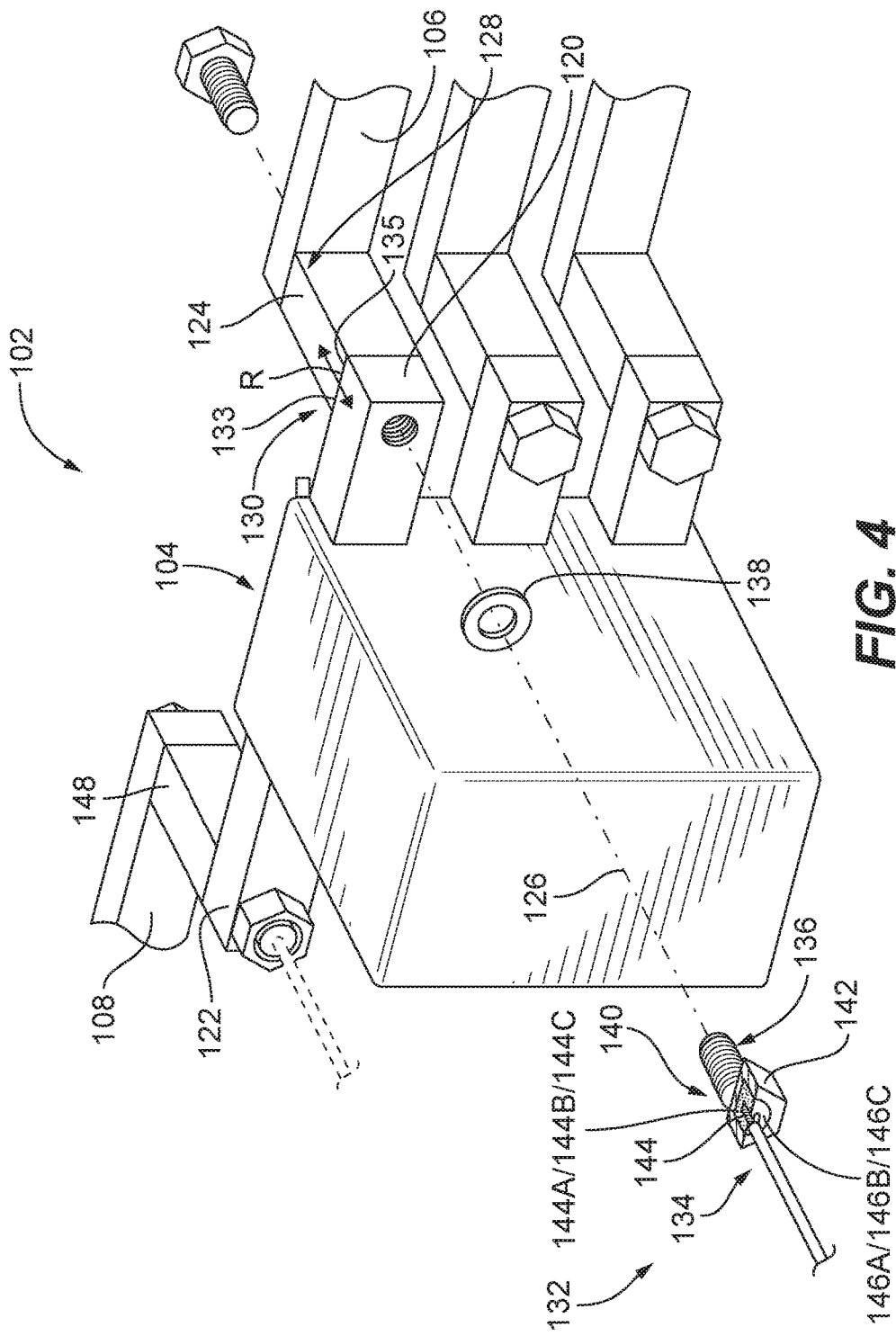
FIG. 4 is a schematic view of a first embodiment of the contactor arrangement of FIG. 1, showing a temperature sensor connected to a fastener of the contactor arrangement.

With reference to FIG. 4, contactor arrangement 102 is shown. For purpose of discussion purposes only, and not for purposes of limitation, contactor arrangement 102 will be discussed in the context of a single phase. It is to be understood and appreciated that contactor arrangement 102 can have more than one phase, e.g., a two-phase contactor arrangement or a three-phase arrangement.

Contactor arrangement 102 supports contactor 104 and provides electrical communication between input bus bar 106 and output bus bar 108 via contactor 104. Contactor 104 has a first conductor 120, e.g., an input tab, a second conductor 122, e.g., an output tab, with a switching element (not shown for clarity reasons) contained within its interior for electrically connecting first conductor 120 with second conductor 122 according to a control signal received through contactor control lead 112 (shown in FIG. 2). Although described herein in the context of being a first conductor and a second conductor, it is to be understood and appreciated that first conductor 120 and/or second conductor can be a tab, a lead, a wire, or any other conductive structure, as suitable for an intended application. It is contemplated that the switching element can be a movable mechanical element or a solid-state device, as suitable for an intended application.

First conductor 120 and second conductor 122 extend laterally from contactor 104 on laterally opposite sides from one another. First conductor 120 is electrically connected to input bus bar 106 by an input post 124. Input post 124 defines a post axis 126 which extends longitudinally along the length of input post 124 between opposed bus bar end 128 and conductor end 130 of input post 124.

A fastener 132 retains first conductor 120 to input post contactor end 130. Fastener 132 has a head 134 which protrudes from input post contactor end 130 and an opposed threaded segment 136. Threaded segment 136 extends along post axis 126 and is threadably seated within an interior portion of input post 124 along post axis 126. A washer 138 sits between input post contactor end 130 and fastener head 134, threaded engagement of fastener threaded segment 136 compressively fixing washer 138 between fastener head 134 and input post contactor end 130. In certain embodiments, washer 138 is a wave washer for retaining a preload applied to fastener 132. It is contemplated that fastener 132 and washer 138 be formed from and electrically conductive material, such as steel or a stainless steel alloy.

Fastener head 134 has a cavity 140. Cavity 140 is externally accessible from an end of fastener 132 axially opposite input post 124. Cavity 140 is arranged along post axis 126 and is circumferentially surrounded by a plurality of fastener tool engagement features 142, which may be flats, to allow for application (and re-application) of a preload to fastener 132. As will be appreciated, preloading fastener 132 exerts compressive force between contacting surfaces 133 and 135 of first conductor 120 and input post contactor end 130, reducing the electrical resistance between the components and limiting resistive heating due to the interface between the components.

A temperature sensor 144 is seated within cavity 140. Temperature sensor 144 is electrically isolated from fastener 132. In certain embodiments, temperature sensor 144 includes a resistance based device, such as a thermocouple 144A or a thermistor 144B. The thermocouple 144A or thermistor 144B can be coupled to fastener 132 by an epoxy 146A, epoxy 146A mechanically coupling temperature sensor 144 to fastener head 134, providing thermal communication between temperature sensor 144 and contactor 104, and electrically isolating temperature sensor 144 from electrical current traversing contactor arrangement 102. In accordance with certain embodiments, temperature sensor 144 can include a semiconductor device 144C. Being electrically isolated within an electrical package, semiconductor device 144C can be connected to fastener 132 by a solder 146B or braze 146C.

As will be appreciated, the electrical isolation provided by epoxy 146 allows for temperature sensing using a resistance-based measurement device, simplifying temperature measurement acquisition in the high voltage environment that can be present around critical contactors. Examples of suitable epoxy materials include Omegabond® 101, available from Omega Engineering Inc. of Stamford, Conn. Such epoxy materials can provide sufficient thermal conductivity over the temperature range of contactor arrangement 102 to provide reliable indication of contactor temperature, provide sufficient electrical insulation to separate temperature sensor 144 from current transiting fastener 132, and have resilience sufficient to accommodate cyclic expansion and contraction of fastener head 134 due to resistive heating associated with current flow through contactor arrangement 102.

Although contactor arrangement 102 has been described with respect to first conductor 120, it is to be understood and appreciated that second conductor 122 can be connected, with or without a second temperature sensor, to output bus bar 108 through output post 148. A second temperature sensor (shown by dashed line) can be thermally coupled to second conductor 122. It is also contemplated that a single sensor can be thermally coupled to second conductor 122 for determining contactor temperature based on the temperature of second conductor 122, without a measurement of temperature of first conductor 120. In certain embodiments, a single temperature sensor is coupled to contactor 104, e.g., on either first conductor 120 or second conductor 122. In accordance with certain embodiments, a single temperature sensor is coupled to each phase of contactor 104, e.g., on either first conductor 120 or second conductor 122. It is contemplated that temperature sensors can be coupled to both first conductor 120 and second conductor 122, e.g., two temperature sensors per phase of a polyphase contactor.

Figure 5A:
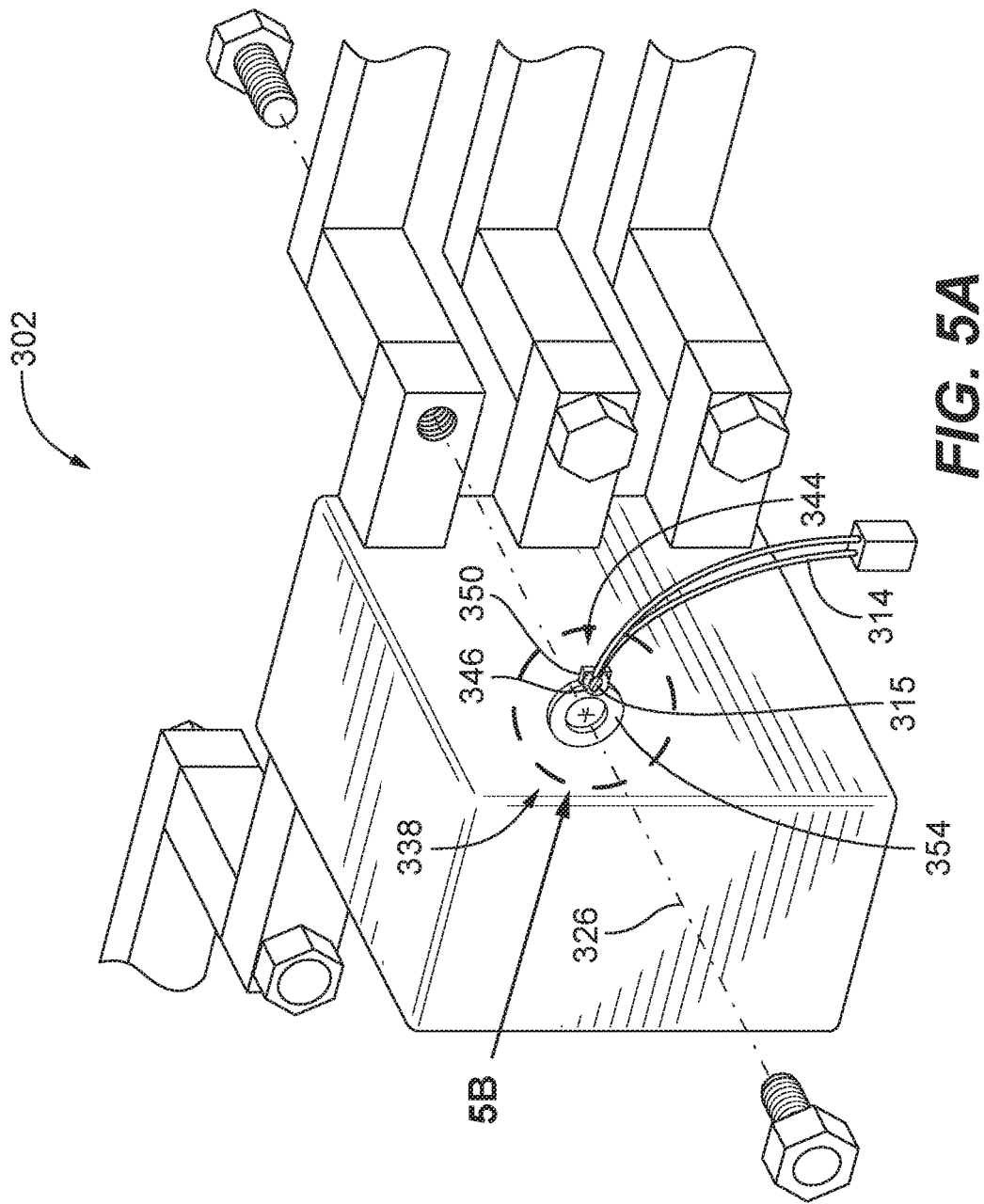
FIGS. 5A and 5B are schematic views of a second embodiment of the contactor arrangement of FIG. 1, showing contactor with a temperature sensor connected to a contactor by a washer and sensor connection at the washer, respectively.

With reference to FIG. 5A, another exemplary embodiment of a contactor arrangement 302 is shown. Contactor arrangement 302 is similar to contactor arrangement 102 and additionally includes a washer-mounted temperature sensor 344 with lead 314 and a junction 315. In this respect contactor arrangement 302 includes a washer 338 having a radially extending tab 350. Radially extending tab 350 extends radially outward from an annular body 354 of washer 338 relative to post axis 326 and receives temperature sensor 344, which is fixed to tab 350 by epoxy 346.

Figure 5B:
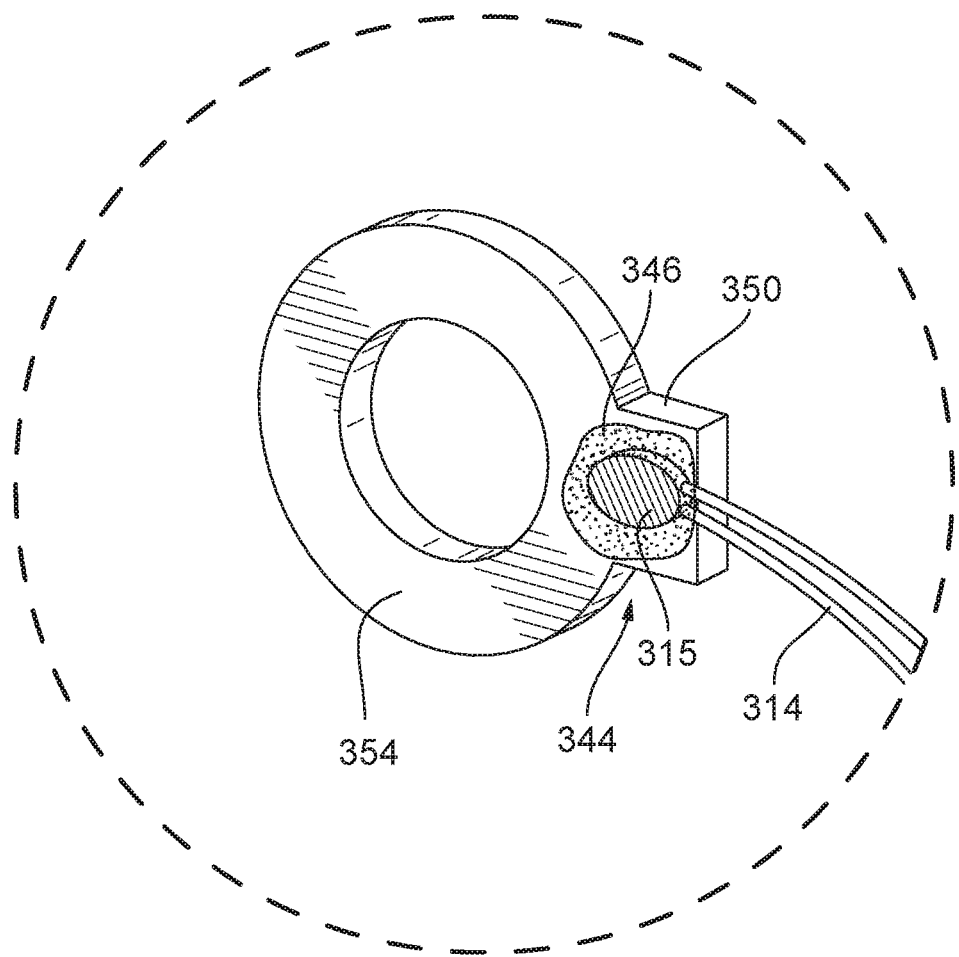

Referring to FIG. 5B, epoxy 346 provides thermal communication between temperature sensor 344 and contactor arrangement 302 (shown in FIG. 5A) electrical isolation of temperature sensor 344 from current flowing through contactor arrangement 302, and resilience to accommodate geometric change of tab 350 due to cyclic thermal expansion and contraction of tab 350 from resistive heating of current-carrying components of contactor arrangement 302. As above, temperature sensor 344 can include a thermistor, a thermocouple, or a semiconductor device couples by epoxy, solder, or braze. As will be appreciated by those of skill in the art in view of the present location, measuring temperature at tab 350 can provide a relatively accurate approximation of contactor temperature due to the proximity of tab 350 to first conductor 320 of contactor 304.

As the power level accommodated by aircraft electrical systems increase contactors are called upon to handle increased power levels. In some contactor arrangements, age and contactor usage from cycling between on and off states can cause increases in electrical resistance and heat generation from resistive heating of current carrying components, potentially leading to reduced reliability and/or failure of the contactor. The tendency to design some types of power distribution panels to handle electrical loads near or at the rated capacity of the contactor can also make the electrical system sensitive to change (e.g., degradation) of the contactors.

In embodiment described herein contactor arrangements include sensors arranged to provide information regarding the health of contactors supported by the contactor arrangement. For example, in certain embodiments, the contactor arrangement includes a temperature sensor in thermal communication with the sensor to provide a signal indicative of the thermal health of the contactor. This allows for monitoring degradation of the contactor and/or the contactor arrangement over time. In accordance with certain embodiments, a thermocouple or thermistor is employed for measuring temperature of a fastener or washer of the contactor arrangement, such as between a fastener connecting the contactor to a contactor post. It is contemplated that the temperature information from the temperature sensor can be combined with electrical data, e.g., load current and/or contactor voltage drop, ambient environmental conditions (e.g., pressure and/or temperature) as inputs to a temperature behavior model of the contactor. In accordance with further embodiments, the temperature information is used to determine the urgency of any need to replace the contactor or service the contactor arrangement according to the extent of degradation indicated by the thermal information. For example, a determined contactor temperature can be compared to a temperature warning limit, a design temperature limit, and/or a specification temperature limit to flag the contactor for immediate replacement and/or service.

The methods and systems of the present disclosure, as described above and shown in the drawings, provide for contactor arrangements and power distribution panels with superior properties including contactor health monitoring during the service life of the contactor arrangement. While the apparatus and methods of the subject disclosure have been shown and described with reference to preferred embodiments, those skilled in the art will readily appreciate that change and/or modifications may be made thereto without departing from the scope of the subject disclosure.

What is claimed is:

1. A contactor arrangement, comprising:
    a post defining a post axis;
    a fastener configured to electrically attach a conductor of a contactor to the post, the fastener fixed to the post along the post axis; and
    a temperature sensor positioned and configured to be in thermal communication with the conductor, the sensor in thermal communication with the post through the fastener and electrically insulated from the post.

2. The arrangement as recited in claim 1, wherein the sensor is bonded to the fastener along the post axis by an epoxy joint.

3. The arrangement as recited in claim 1, wherein the fastener has a head and a threaded segment arranged at opposite ends, the threaded segment seated in the post, the head protruding from an end of the post and seating the sensor.

4. The arrangement as recited in claim 3, wherein the head has cavity, the sensor being potted within the cavity by an epoxy.

5. The arrangement as recited in claim 3, further comprising a wave washer seated between the head of the fastener and the post.

6. The arrangement as recited in claim 3, wherein the head includes a plurality of flats arranged circumferentially about the fastener for preloading the fastener.

7. The arrangement as recited in claim 1, further comprising washer with a radially extending tab seated along a post axis defined by the post between the fastener and the post.

8. The arrangement as recited in claim 7, wherein the sensor is bonded to the tab by an epoxy joint.

9. The arrangement as recited in claim 1, further comprising a bus bar fixed to an end of the post opposite the conductor.

10. The arrangement as recited in claim 1, wherein the sensor includes one or more of a thermistor, a thermocouple, and a semiconductor device.

11. A power distribution panel, comprising:
    a contactor arrangement including:
        a post defining a post axis;
        a fastener configured to electrically attach a conductor of a contactor to the post, the fastener fixed to the post along the post axis and; and
        a temperature sensor positioned and configured to be in thermal communication with the conductor, the sensor in thermal communication with the post through the fastener and electrically insulated from the post;
    a contactor fixed between the fastener and an end of the post by the conductor of the contactor;
    a bus bar fixed to an end of the post opposite the conductor; and
    a control module in communication with the contactor, the temperature sensor and the power distribution panel.

12. The power distribution panel as recited in claim 11, further comprising a contactor temperature lead connecting the control module to the sensor to provide temperature information to the control module.

13. The power distribution panel as recited in claim 11, further comprising a load lead connected to the bus bar and arranged to provide a signal indicative of magnitude of current flowing through the bus bar.

14. The power distribution panel as recited in claim 11, further comprising a panel temperature lead connecting the control module to provide a signal indicative of temperature of the power distribution panel ambient environment.

15. The power distribution panel as recited in claim 11, wherein the control module is a bus power control unit disposed in communication with a memory having instructions recorded thereon that cause the control module to:
    receive a contactor health signal;
    determine temperature of the contactor;
    compare the contactor temperature to a plurality of predetermined values;
    determine a health state of the contactor based on the comparison of the temperature to the predetermined values, and
    monitor the contactor temperature when the health state of the contactor is determined healthy, and flag the contactor for service when the health state of the contactor is determined to be unhealthy.

16. The power distribution panel as recited in claim 15, wherein the memory has recorded thereon predetermined values includes a warning limit, a design limit that is higher than the warning limit, and a specification limit that is higher than the design limit.

17. A method of monitoring health of a contactor, comprising:
    monitoring ambient temperature around the contactor;
    monitoring current passing across the contactor;
    monitoring temperature of the contactor while current is passing thereacross wherein monitoring temperature of the contactor includes comparing the temperature of the contactor to a plurality of predetermined values; and
    determining a health state of the contactor based on the comparison of the temperature to the predetermined values,
    wherein the plurality of predetermined values are based on empirical data previously gathered on similar contactors under similar conditions of ambient temperature and current load.

18. The method as recited in claim 17, wherein the plurality of predetermined values include a specification limit, and further comprising flagging the contactor for service if the temperature of the contactor exceeds the specification limit.

19. The method as recited in claim 17, wherein the plurality of predetermined values include with a design limit, and further comprising flagging the contactor as degraded if the temperature of the contactor exceeds the design limit.

20. The method as recited in claim 17, wherein the plurality of predetermined values include with a warning limit, and further comprising flagging the contactor for service if the temperature of the contactor exceeds the warning limit.

* * * * *